(12) United States Patent
Goldmann

(10) Patent No.: US 8,132,775 B2
(45) Date of Patent: Mar. 13, 2012

(54) SOLDER MOLD PLATES USED IN PACKAGING PROCESS AND METHOD OF MANUFACTURING SOLDER MOLD PLATES

(75) Inventor: Lewis S Goldmann, Bedford, NY (US)

(73) Assignee: International Business Machines Corporation, Armonk, NY (US)

( * ) Notice: Subject to any disclaimer, the term of this patent is extended or adjusted under 35 U.S.C. 154(b) by 382 days.

(21) Appl. No.: 12/111,372

(22) Filed: Apr. 29, 2008

(65) Prior Publication Data

US 2009/0266972 A1 Oct. 29, 2009

(51) Int. Cl.
*H01L 21/441* (2006.01)
*B23K 31/02* (2006.01)
*B23K 35/02* (2006.01)

(52) U.S. Cl. ......... 249/119; 249/62; 249/115; 249/134; 425/112; 228/180.22; 228/254; 438/616

(58) Field of Classification Search ............ 249/78, 249/114.1, 115, 119, 134, 155, 61, 62; 425/110, 425/112; 264/219; 438/616; 228/118, 254, 228/257, 180.22
See application file for complete search history.

(56) References Cited

U.S. PATENT DOCUMENTS

| | | | | |
|---|---|---|---|---|
| 3,844,858 A * | 10/1974 | Bean | ........... | 438/16 |
| 3,871,015 A | 3/1975 | Lin et al. | | |
| 4,957,592 A * | 9/1990 | O'Neill | ........... | 216/2 |
| 5,273,805 A * | 12/1993 | Calhoun et al. | ........ | 428/156 |
| 5,316,618 A * | 5/1994 | van Lintel | ........... | 438/701 |
| 5,578,528 A * | 11/1996 | Wuu et al. | ........... | 216/2 |
| 5,851,928 A * | 12/1998 | Cripe et al. | ........... | 438/748 |
| 6,090,301 A * | 7/2000 | Mizukoshi et al. | ........ | 216/17 |
| 6,121,576 A * | 9/2000 | Hembree et al. | ........ | 219/209 |
| 6,234,373 B1 * | 5/2001 | Wark | ........... | 228/19 |
| 6,332,569 B1 * | 12/2001 | Cordes et al. | ........ | 228/254 |
| 6,528,346 B2 * | 3/2003 | Ochiai et al. | ........ | 438/108 |
| 6,864,152 B1 * | 3/2005 | Mirbedini et al. | ........ | 438/427 |
| 2008/0254570 A1 * | 10/2008 | Kley | ........... | 438/105 |
| 2009/0001248 A1 * | 1/2009 | Farinelli et al. | ........ | 249/119 |
| 2009/0280649 A1 * | 11/2009 | Mayer et al. | ........ | 438/676 |

OTHER PUBLICATIONS

"IBM and SUSS Announce c4np Semiconductor Technology Agreement", Sep. 13, 2004, pp. 1-4, URL: http://www.research.ibm.com/c4np/.

"Injection Molded Soldering", pp. 1-3, URL: http://www.research.ibm.com/ims/.

* cited by examiner

*Primary Examiner* — Joseph Del Sole
*Assistant Examiner* — Dimple Bodawala
(74) *Attorney, Agent, or Firm* — Joe Petrokaitis; Roberts Mlotkowski Safran & Cole, P.C.

(57) ABSTRACT

Solder mold plates and methods of manufacturing the solder mold plates are provided herein. The solder mold plates are used in controlled collapse chip connection processes. The solder mold plate includes a plurality of cavities. At least one cavity of the plurality of cavities has a different volume than another of the cavities in a particular chip set site. The method of manufacturing the solder mold plate includes determining susceptible white bump locations on a chip set. The method further includes forming lower volume cavities on the solder mold plate which coincide with the susceptible white bump locations, and forming higher volume cavities on the solder mold plate which coincide with less susceptible white bump locations.

14 Claims, 6 Drawing Sheets

SOLDER MOLD PLATES USED IN PACKAGING PROCESS AND METHOD OF MANUFACTURING SOLDER MOLD PLATES

FIELD OF THE INVENTION

The present invention generally relates to solder mold plates and methods of manufacturing the solder mold plates, and more particularly, to solder mold plates used in controlled collapse chip connection processes and methods of manufacturing the solder mold plates.

BACKGROUND OF THE INVENTION

Traditionally, C4 (Controlled Collapse Chip Connection) bumps have been used to bond a chip to a chip carrier (substrate). Conventionally, the C4 bumps (solder bumps) are made from lead tin solder. For example, lead is known to mitigate coefficient or thermal expansion (CTE) mismatch between the package and the substrate (i.e., organic laminate). For organic substrates, the solder commonly is made from eutectic lead tin. Accordingly, stresses imposed during the cooling cycle are mitigated by the C4 bumps, thus preventing delaminations or other damage from occurring to the chip or the substrate.

However, lead-free requirements are now being imposed by many countries forcing manufacturers to implement new ways to produce chip to substrate joints. For example, solder interconnects consisting of tin/copper, tin/silver and SAC alloys have been used as a replacement for leaded solder interconnents. However, the higher melting points and stiffness of such lead free solders vs. eutectic leaded solders causes a transfer of stress through the C4 joint during assembly process (e.g., during a cooling cycle after reflow). Cracks in chip metallurgy under C4 bumps have been observed, which are named "white bumps" due to their appearance in sonoscan type inspection process.

More specifically, in practice, the organic laminate has a CTE of about 18 to 20; whereas, the CTE of the chip is about 3. During the soldering process, e.g., reflow oven, the temperatures can range from about 250° C. to 260° C. This high temperature expands the organic laminate more than the chip due to the differences in the CTE. As the package (laminate, solder and chip) begins to cool, the solder begins to solidify (e.g., at about 225° C.) and the laminate begins to shrink as the chip remains substantially the same size. The chip, substrate and solder joints must deform to maintain electrical and mechanical continuity during cooling which give rise to a complicated stress pattern transmitted to the chip wiring just adjacent to the solder ball. Specific sites often have been found to be more susceptible to white spots based on its location, wiring pattern or other properties. This process and resulting delamination is shown, for example, in FIG. 1.

In response to the need for lead free soldering, new techniques have been developed to bond the chip to a substrate. One such technique is Controlled Collapse Chip Connection New Process (C4NP) (also known as IMS (Injection Molded Soldering)) which is a flip chip bumping technology developed at International Business Machines Corp. IMS uses no hazardous gases or chemicals and is able to process newer lead-free solders.

IMS uses mold plates containing cavities having uniform volumes filled with solder and aligned to substrates that receive the solder from the cavities. An exemplary mold plate is shown in FIG. 2, which shows uniform cavities throughout. Cavities in the mold plates are in a pattern that is the mirror image of the solder receiving pads on the final substrate or wafer. Cavities can be produced in the mold plate by any one of a number of techniques, the selection of which is dependent upon the cavity size and pitch as well as the mold plate material. Cavity volume uniformity, however, was found to be essential to ensure quality control. Specifically, cavity uniformity was found to ensure that all sites form a complete joint and that there is no shorting between adjacent joints.

In IMS processes, a head of an IMS apparatus is filled with molten solder and moves in relation to the cavities contained in the mold plate, both of which are above solder liquidus temperature. As the head scans across the mold plate, the solder from the reservoir, under constant positive pressure, passes through a dispensing slot and into the uniform cavity volumes. After the scanning process, the mold plate is cooled to solidify the solder. After inspection of the mold plates, the mold plates may be either immediately sent for transfer or stored in a non-oxidizing environment. The mold plate is subsequently aligned to the wafer and passed through a furnace for bump transfer. Since it uses only the solder volume required for each part, there is no solder waste which is especially important for costlier alloys. Thus it is economical and environmentally friendly.

SUMMARY OF THE INVENTION

In a first aspect of the invention, a solder mold plate comprises a plurality of cavities. At least one cavity of the plurality of cavities has a different volume than another of the cavities in a particular chip set site.

In a further aspect of the invention, a solder mold plate comprises lower volume cavities formed in at least a first location on the solder mold plate coinciding with areas that are susceptible to wiring delamination. The solder mold plate also comprises higher volume cavities formed near and at a center of the solder mold plate.

In an additional aspect of the invention, a method of manufacturing a solder mold plate comprises determining susceptible white bump locations on a chip set. The method further comprises forming lower volume cavities on the solder mold plate which coincide with the susceptible white bump locations, and forming higher volume cavities on the solder mold plate which coincide with less susceptible white bump locations.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention relates to solder mold plates and methods of manufacturing the solder mold plates, and more particularly, to solder mold plates used in controlled collapse chip connection processes and method of manufacturing the solder mold plates. By implementing the invention, it is possible to prevent wiring layers from delaminating during packaging. More specifically, the present invention provides the ability of the wiring levels to maintain their integrity during cooling when the laminate substrate is contracting at a faster rate than the chip due to a mismatch in CTE.

To accomplish the advantages of the present invention, in embodiments, the volumes of cavities on the solder mold plate will vary depending on a location of white bump formation. For example, the solder mold plate is designed to provide more solder volume on sites that are less susceptible to delamination (e.g., white bump damage) and provide less solder volume on sites that are more susceptible to white bump damage caused by, e.g., stress components, wiring patterns, etc. In embodiments, an average height of the solder bumps should be maintained, as determined by the summation of axial forces and should preferably approach the spherical height of the average volume. That is, the high volume solder bumps, in implementation, will be squeezed down from their spherical heights and the low volume solder bumps will be stretched up due to the surface tension imposed by the laminate (substrate) and the chip.

Solder Mold Plate and Structure According to a First Aspect of the Invention

Figure 1:
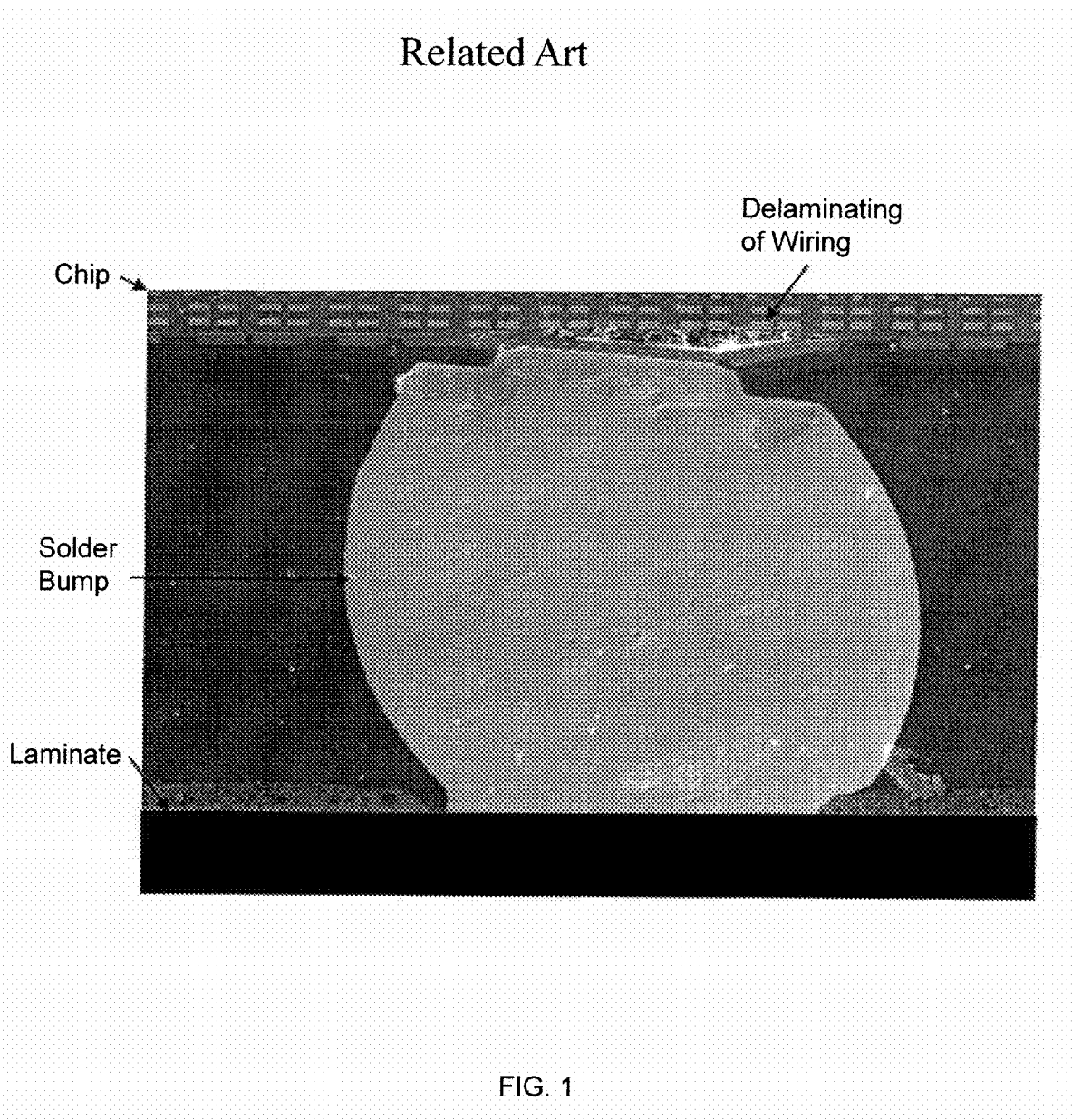
FIG. 1 shows a delaminated wiring layer on a chip after cooling of the package.
Figure 2:
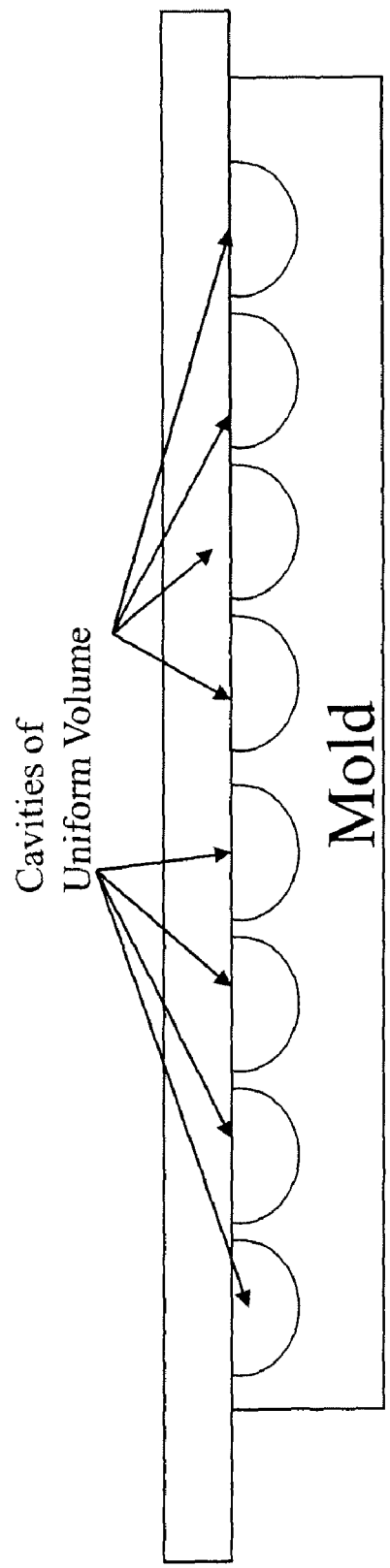
FIG. 2 shows a conventional exemplary solder mold plate with uniform volumes.
Figure 3:
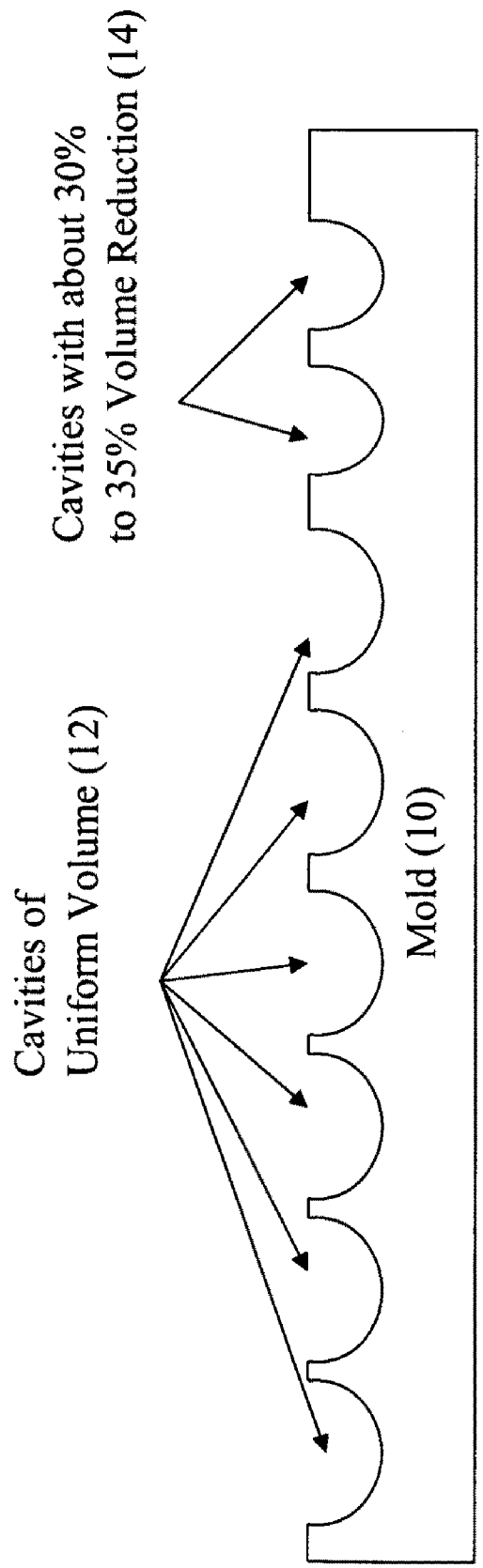
FIG. 3 shows a solder mold plate in accordance with a first aspect of the invention.

FIG. 3 represents a solder mold plate in accordance with a first aspect of the invention. More specifically, FIG. 3 shows a plurality of cavities 12 of uniform volume on a solder mold plate 10. FIG. 3 also shows cavities 14 with lower volume than the cavities 12 (which correspond to a particular chip set site). In embodiments, the cavities 14 can have a total reduction in volume of about 30% to about 35% in comparison to cavities 12 (based on a calculation for a 3-on-6 solder bump). (As should be understood by those of skill in the art, 3-on-6 refers to a 3 mil. contact diameter and a 6 mil. center to center distance between solder bumps.) In further embodiments, the percentage decrease in volume of the cavities 14 can be less than about 30%, depending on the amount and location of the cavities on the solder mold plate 10. In one embodiment, the average volume of the cavities is about 30 mil.$^3$.

In implementations, the locations of the cavities are based on white bump formations. To manufacture the cavities, the susceptible areas of white bump locations are determined (e.g., chip set site). These susceptible locations may at high stress concentrations, high wiring pattern density, etc. Once these locations are determined, the cavities can be formed in the solder mold plate 10 corresponding to certain locations. For example, the cavities 12 coincide with sites that are found to be less susceptible to delamination (e.g., white bump damage) and the cavities 14 coincide with sites that found to be more susceptible to white bump damage. For example, the cavities 14 may coincide with a corner of a chip, where the wiring levels are more susceptible to delaminating issues. It should be understood that the cavities 14 may be clustered about two or more susceptible sites or at a single site of known or possible susceptibility to white bump formation.

In further implementations, the cavities 14 are a small number compared to the total number of cavities on the mold plate 10. In particular, again using a calculation based on a 3-on-6 solder bump, about 5% to 10% of the cavities can have a reduction in volume within the range of about 30% to 35%. With a smaller number of cavities 14, it has been found that the solder bump formation will not significantly affect the overall height off of the substrate. In this way, the distance between the substrate and the chip, as well as the distance between adjacent solder bumps, will be at a sufficient distance so as to not electrically short.

Figure 4:
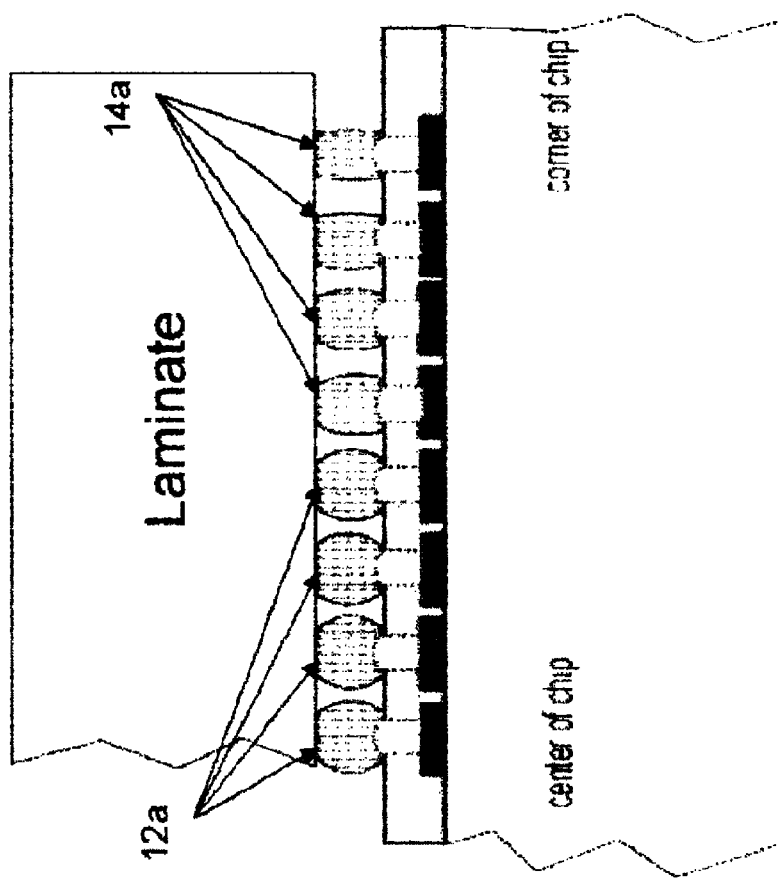
FIG. 4 shows a chip package formed using the solder mold plate of FIG. 3.

FIG. 4 shows a chip package formed with the solder mold plate of FIG. 3. As shown in FIG. 4, the high volume solder bumps 12a (corresponding to the high volume cavities 12) are squeezed down from their spherical heights and the low volume solder bumps 14a (corresponding to the lower volume cavities 14) are stretched up due to the surface tension imposed by the laminate (substrate) and the chip. In this embodiment, the low volume solder bumps 14a are located at a corner of a chip (chip set site), where wiring levels are subject to greater stress which may cause delaminating issues.

It should be recognized that analytical techniques are available which can be used to calculate how much stretching may be obtained on the susceptible sites insuring (i) that the low volume solder balls on the chip will touch the substrates pad as the chip sinks down during joining and (ii) the high volume solder balls that are squeezed do not violate the nearest approach criterion.

Solder Mold Plate and Structure According to a Second Aspect of the Invention

Figure 5:
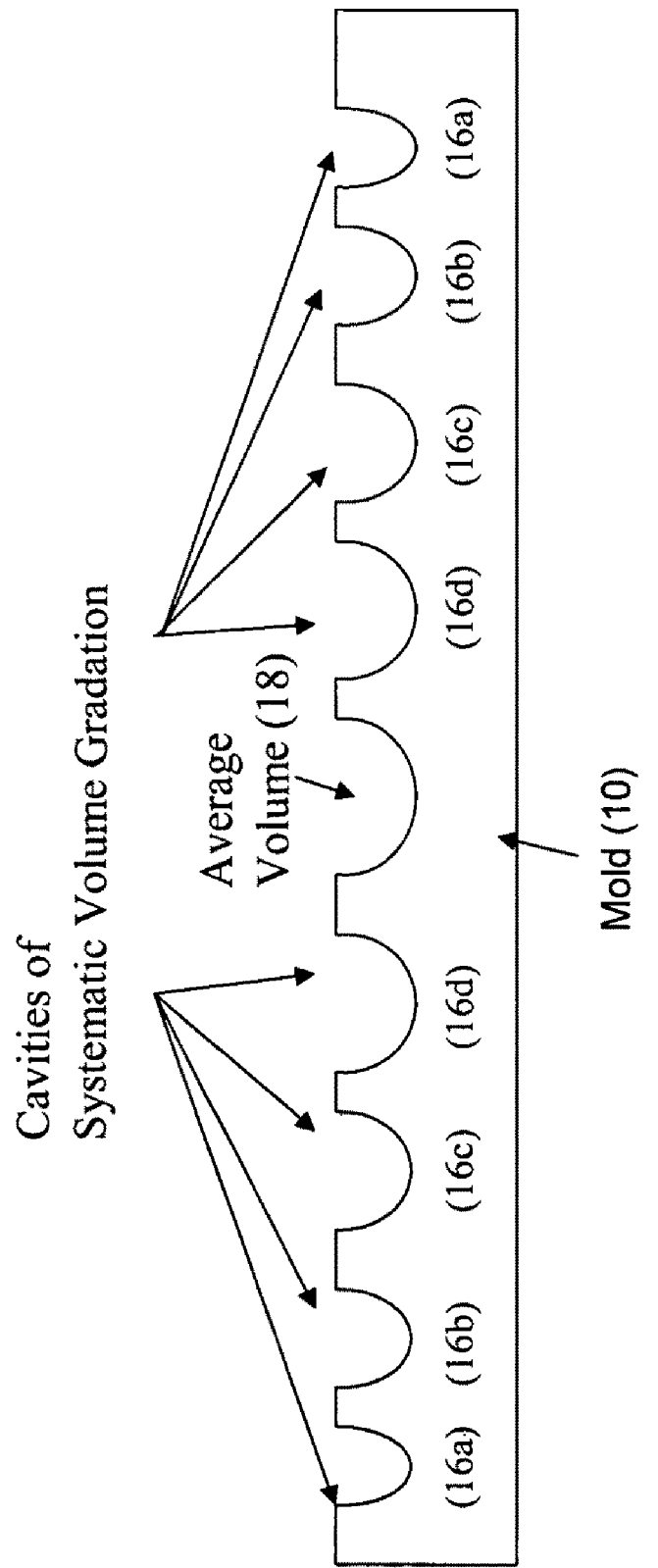
FIG. 5 shows a solder mold plate in accordance with a second aspect of the invention.

FIG. 5 represents a solder mold plate in accordance with a second aspect of the invention. More specifically, FIG. 5 shows a plurality of cavities 16a-16d and 18 each of a different volume, respectively, on a solder mold plate 10. In this embodiment, the cavities 16a-16d will have a gradual decrease in volume gradation towards the edges of mold plate 10, away from the cavity 18. In this way, the cavity 18 will have a higher volume than the cavities 16a-16d. In this embodiment, the summation of the volumes of the cavities 16a-16d and 18 are calculated to substantially equal a predetermined average volume.

In this embodiment, a maximum of about 15% to about 20% volume deviation from an average volume is contemplated across the solder mold plate 10. In particular, again using a calculation based on a 3-on-6 solder bump, about 15% to 20% reduction in volume, compared to an average volume, is contemplated by the invention for worst case sites, e.g., sites susceptible to white bump formation caused by stress components, wiring patterns, etc. Corresponding to the reduction in volume, a maximum increase in volume of about 15% to 20% is contemplated for locations which are less susceptible to white bump formation.

With this percentage, it has been found that the solder bump formation will not significantly affect the overall height off of the substrate, i.e., the distance between the substrate and the chip, as well as the distance between adjacent solder bumps, will be at a sufficient distance so as to not electrically short. Also, in any scenario, it may be preferable to maintain at least an average volume (or height) of the solder bumps.

As in the previous embodiment, the smaller volume cavities are calculated (or determined) to coincide with sites that are more susceptible to delamination (e.g., white bump damage) and the cavities with a larger volume coincide with sites that are less susceptible to white bump damage. Prior to manufacturing the cavities, the susceptible areas of white bump locations are determined. Once these locations are determined, the cavities can be formed in the solder mold plate 10 corresponding to certain locations. For example, the cavities 16a and 16b may coincide with a corner or edges of a chip, where the wiring levels are found to be more susceptible to delaminating issues (caused by stress components, wiring patterns, etc.); whereas, the cavity 18 coincides with the center of the chip.

Figure 6:
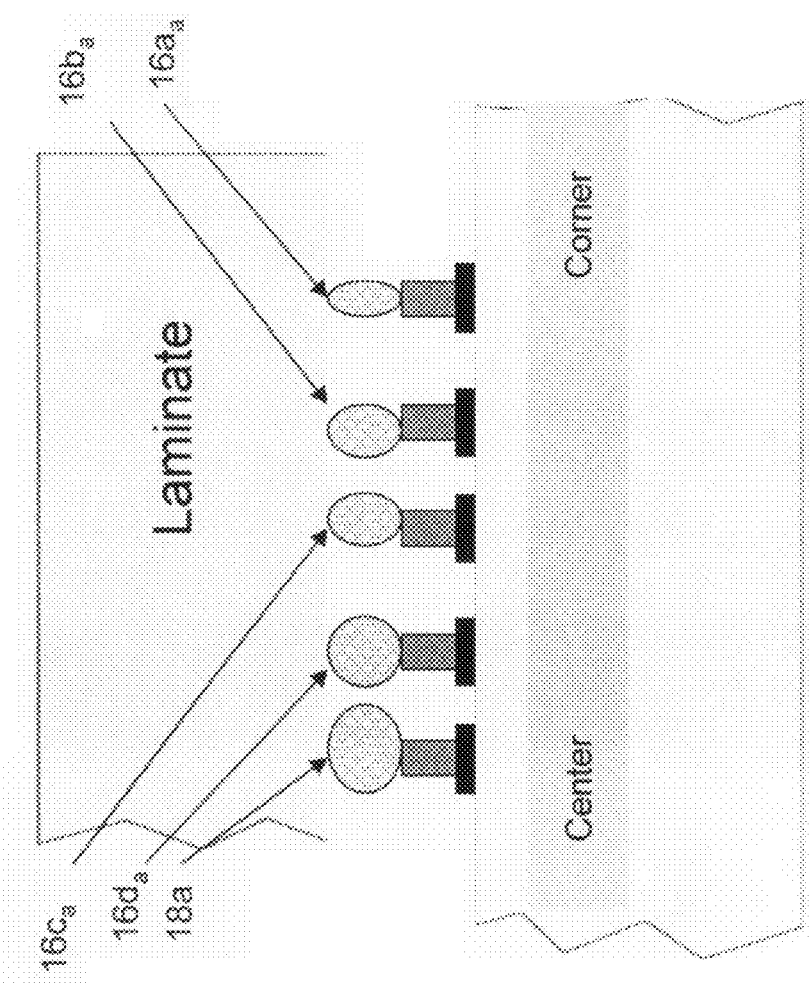
FIG. 6 shows a chip package formed using the solder mold plate of FIG. 5.

FIG. 6 shows a chip package formed with the solder mold plate of FIG. 5. As shown in FIG. 6, the high volume solder bumps 18a and 16$d_a$ (corresponding to the high volume cavities 18 and 16d) are squeezed down from their spherical heights. Also, the low volume solder bumps, e.g., 16$c_a$-16$a_a$ (corresponding to the lower volume cavities 16c-16a) are gradually stretched up from their spherical heights due to the surface tension imposed by the laminate (substrate) and the chip. In this embodiment, the volume of the solder bumps is gradually decreasing in volume towards the edge of the chip (chip set site). The height of the solder bumps is essentially constant across the chip and is essentially the same as if all volumes were identical and equal.

As with the first aspect of the invention, analytical techniques are available which can be used to calculate how much stretching may be obtained on the susceptible sites insuring (i) that the low volume solder balls on the chip will touch the substrates pad as the chip sinks down during joining and (ii) the high volume solder balls that are squeezed do not violate the nearest approach criterion.

ADDITIONAL EMBODIMENTS OF THE INVENTION

The structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

What is claimed is:

1. A solder mold plate comprising a plurality of cavities, wherein:
   at least one cavity of the plurality of cavities has a different volume than another of the cavities in a particular chip set site;
   the at least one cavity coincides with locations on a chip that are susceptible to white bump damage;
   the at least one cavity is two or more cavities which each having a reduction in volume of about 30% to about 35% in comparison to the another of the cavities; and
   the two or more cavities is a plural amount of cavities which do not exceed about 5% to 10% of a total amount of the plurality of cavities.

2. The solder mold plate of claim 1, wherein the at least one cavity has a lower volume than the another of the cavities.

3. The solder mold plate of claim 1, wherein an average volume of the at least one cavity and the another of the cavities equals a predetermined volume.

4. A solder mold plate comprising a plurality of cavities, wherein:
   at least one cavity of the plurality of cavities has a different volume than another of the cavities in a particular chip set site;
   the at least one cavity coincides with locations on a chip that are susceptible to white bump damage;
   the at least one cavity is two or more cavities which have a gradual decrease in volume gradation towards edges of the solder mold plate;
   a volume degradation across the solder mold plate is a maximum of about 15% to about 20% volume reduction; and
   the about 15% to 20% volume reduction is offset by about 15% to 20% increase in volume in at least one of the another cavities.

5. The solder mold plate of claim 4, wherein the gradual decrease in volume is away from a center cavity.

6. A solder mold plate, comprising:
   a mold plate with a plurality of cavities for molding solder;
   lower volume cavities formed in at least a first location on the solder mold plate coinciding with areas that are susceptible to wiring delamination; and
   higher volume cavities formed near and at a center of the solder mold plate,
   wherein:
      the plurality of cavities comprise the lower volume cavities and the higher volume cavities;
      the location in which the lower volume cavities and the higher volume cavities are formed in the mold plate are determined such that the lower volume cavities coincide with the areas of a chip set that are susceptible to wiring delamination and the higher volume cavities coincide with areas of the chip set that are less susceptible to wiring delamination;
      the lower volume cavities each having a reduction in volume of about 30% to about 35% in comparison to the higher volume cavities, the reduction in volume is based on a calculation for a 3-on-6 solder bump;
      the lower volume cavities do not exceed about 5% to 10% of a total amount of the plurality of cavities;
      each one of the plurality of cavities has a rounded, semi-circular shape; and
      the mold plate and the plurality of cavities are configured such that high volume solder bumps formed by the higher volume cavities are squeezed down from their spherical heights, and lower volume solder bumps formed by the lower volume cavities are stretched up due to surface tension imposed by a substrate and a chip.

7. The solder mold plate of claim 6, wherein the lower volume cavities are positioned in a decreasing volume with respect to the center of the solder mold plate.

8. The solder mold plate of claim 6, wherein a predetermined average volume is maintained with the lower volume cavities and the higher volume cavities.

9. The solder mold plate of claim 1, wherein:
   the plurality of cavities are configured such that an average height of produced solder bumps is maintained as determined by summation of axial forces; and
   the average height approaches a spherical height of an average volume of the plurality of cavities.

10. The solder mold plate of claim 9, wherein the average volume of the plurality of cavities is about 30 cubic mils.

11. The solder mold plate of claim 1, wherein each one of the plurality of cavities has a rounded, semi-circular shape.

12. The solder mold plate of claim 1, wherein the mold plate is configured to produce 3-on-6 solder bumps.

13. The solder mold plate of claim 1, wherein the reduction in volume is based on a calculation for a 3-on-6 solder bump.

14. The solder mold plate of claim 1, wherein the plurality of cavities are configured such that high volume solder bumps formed by higher volume cavities of the plurality of cavities are squeezed down from their spherical heights, and lower volume solder bumps formed by lower volume cavities of the plurality of cavities are stretched up due to surface tension imposed by a substrate and a chip.

* * * * *